United States Patent
Lin et al.

(10) Patent No.: US 9,900,996 B2
(45) Date of Patent: Feb. 20, 2018

(54) PACKAGE SUBSTRATE AND STRUCTURE

(71) Applicant: Siliconware Precision Industries Co., Ltd., Taichung (TW)

(72) Inventors: Chang-Fu Lin, Taichung (TW); Chin-Tsai Yao, Taichung (TW); Ming-Chin Chuang, Taichung (TW); Ko-Cheng Liu, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 141 days.

(21) Appl. No.: 14/453,977

(22) Filed: Aug. 7, 2014

(65) Prior Publication Data

US 2015/0237717 A1    Aug. 20, 2015

(30) Foreign Application Priority Data

Feb. 19, 2014    (TW) .............................. 103105445 A

(51) Int. Cl.
| | |
|---|---|
| *H05K 1/00* | (2006.01) |
| *H05K 3/46* | (2006.01) |
| *H05K 1/09* | (2006.01) |
| *H05K 1/18* | (2006.01) |
| *H05K 1/02* | (2006.01) |
| *H05K 3/28* | (2006.01) |

(52) U.S. Cl.
CPC .. *H05K 3/4644* (2013.01); *H01L 2224/16225* (2013.01); *H01L 2224/32225* (2013.01); *H01L 2224/73204* (2013.01); *H01L 2924/181* (2013.01); *H05K 1/02* (2013.01); *H05K 1/0296* (2013.01); *H05K 1/0298* (2013.01); *H05K 1/181* (2013.01); *H05K 3/284* (2013.01); *H05K 2201/0191* (2013.01); *H05K 2201/09736* (2013.01); *H05K 2201/20* (2013.01); *H05K 2203/0353* (2013.01); *H05K 2203/0369* (2013.01)

(58) Field of Classification Search
CPC ...... H05K 1/02; H05K 1/0296; H05K 1/0298; H05K 2201/20; H05K 2201/09736; H05K 2203/0353; H05K 2203/0369
USPC .................................. 361/748; 174/250, 251
See application file for complete search history.

(56) References Cited

U.S. PATENT DOCUMENTS

| | | | |
|---|---|---|---|
| 6,326,557 B1* | 12/2001 | Cheng .................. | H05K 1/0216 174/255 |
| 2010/0147560 A1* | 6/2010 | Kaneko .................. | H01L 23/13 174/250 |
| 2013/0200472 A1* | 8/2013 | Sunamura ............... | H01L 29/78 257/411 |
| 2014/0118976 A1* | 5/2014 | Yoshikawa ....... | H01L 23/49822 361/763 |

* cited by examiner

*Primary Examiner* — Binh Tran
(74) *Attorney, Agent, or Firm* — Mintz Levin Cohn Ferris Glovsky and Popeo, P.C.; Peter F. Corless; Steven M. Jensen

(57) ABSTRACT

A package substrate is provided, which includes a plurality of dielectric layers and a plurality of circuit layers alternately stacked with the dielectric layers. At least two of the circuit layers have a difference in thickness so as to prevent warpage of the substrate.

17 Claims, 2 Drawing Sheets

PACKAGE SUBSTRATE AND STRUCTURE

CROSS-REFERENCES TO RELATED APPLICATIONS

This application claims under 35 U.S.C. § 119(a) the benefit of Taiwanese Application No. 103105445, filed Feb. 19, 2014, the entire contents of which is incorporated herein by reference.

BACKGROUND OF THE INVENTION

1. Field of the Invention

The present invention relates to package substrates and package structures, and more particularly, to a package substrate having a plurality of dielectric layer and a plurality of circuit layers alternately stacked on one another and a package structure having the package substrate.

2. Description of Related Art

Flip-chip technologies facilitate to reduce chip packaging sizes and shorten signal transmission paths and therefore have been widely used for chip packaging. Various types of packages such as chip scale packages (CSPs), direct chip attached (DCA) packages and multi-chip module (MCM) packages can be achieved through flip-chip technologies.

FIG. 1 is a schematic cross-sectional view of a conventional flip-chip package substrate. Referring to FIG. 1, the package substrate 1 has a plurality of circuit layers 11 therein. The circuit layers 11 have a same thickness, e.g., 19 um.

However, during a temperature cycle test of a flip-chip packaging process, warpage easily occurs to the package substrate due to a big CTE (Coefficient of Thermal Expansion) mismatch or asymmetrical heating between the chip and the package substrate. Consequently, it becomes difficult to form good joints between conductive bumps around an outer periphery of the chip and contacts of the package substrate, thereby reducing the product yield.

To overcome the above-described drawback of warpage of the package substrate, the thickness of the circuit layers can be increased. However, such an increase in the thickness of the circuit layers results in an increase of the overall thickness of the package substrate as well as the final package structure, thereby hindering miniaturization of electronic products.

Therefore, how to overcome the above-described drawbacks has become critical.

SUMMARY OF THE INVENTION

In view of the above-described drawbacks, the present invention provides a package substrate, which comprises: a plurality of dielectric layers; and a plurality of circuit layers alternately stacked with the dielectric layers, wherein at least two of the circuit layers have a difference in thickness.

The present invention further provides a package structure, which comprises: a package substrate having a plurality of dielectric layers and a plurality of circuit layers alternately stacked with the dielectric layers, wherein at least two of the circuit layers have a difference in thickness; and a chip mounted on an upper surface of the package substrate.

In the above-described package substrate and structure, the circuit layer on or close in position to the upper surface of the package substrate can be greater in thickness than the circuit layer on or close in position to a lower surface of the package substrate.

In an embodiment, the uppermost circuit layer closest in position to the upper surface of the package substrate is greater in thickness than the other circuit layers, the lowermost circuit layer closest in position to the lower surface of the package substrate is less in thickness than the other circuit layers, and the circuit layers except the uppermost and lowermost circuit layers have a same thickness.

In an embodiment, the thicknesses of the circuit layers gradually decrease from the upper surface to the lower surface of the package substrate.

In an embodiment, the sum of the thicknesses of half of the circuit layers close in position to the upper surface of the package substrate is greater than the sum of the thicknesses of half of the circuit layers close in position to the lower surface of the package substrate.

In an embodiment, the thickest circuit layer and the thinnest circuit layer have a thickness ratio of 1.2:1 to 2:1. Preferably, the thickest circuit layer and the thinnest circuit layer have a thickness ratio of 1.5:1.

In an embodiment, the thickest circuit layer and the thinnest circuit layer have a thickness difference of 3 to 15 um. Preferably, the thickest circuit layer and the thinnest circuit layer have a thickness difference of 5 to 10 um.

In the above-described package substrate and structure, the number of the circuit layers can be an odd or even number.

In an embodiment, one of the dielectric layers is a core layer and the circuit layers are symmetrically formed on two opposite sides of the core layer.

Therefore, by providing a thickness difference between the circuit layers, the present invention increases the rigidity of the package substrate so as to reduce warpage of the package substrate. Further, the sum of the thicknesses of the circuit layers can be kept unchanged so as not to increase the overall thickness of the package substrate and structure.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower" etc. are merely for illustrative purposes and should not be construed to limit the scope of the present invention.

Figure 1:
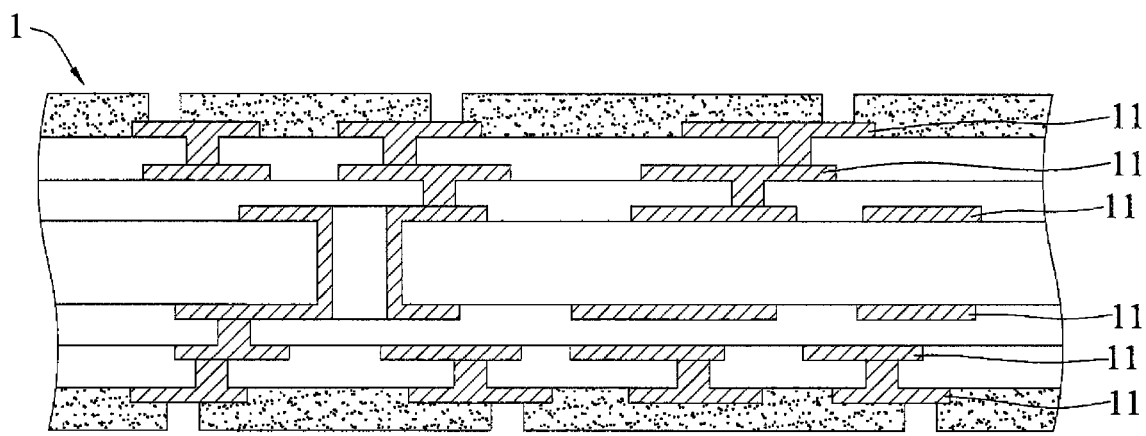
FIG. 1 is a schematic cross-sectional view of a conventional flip-chip package substrate.
Figure 2:
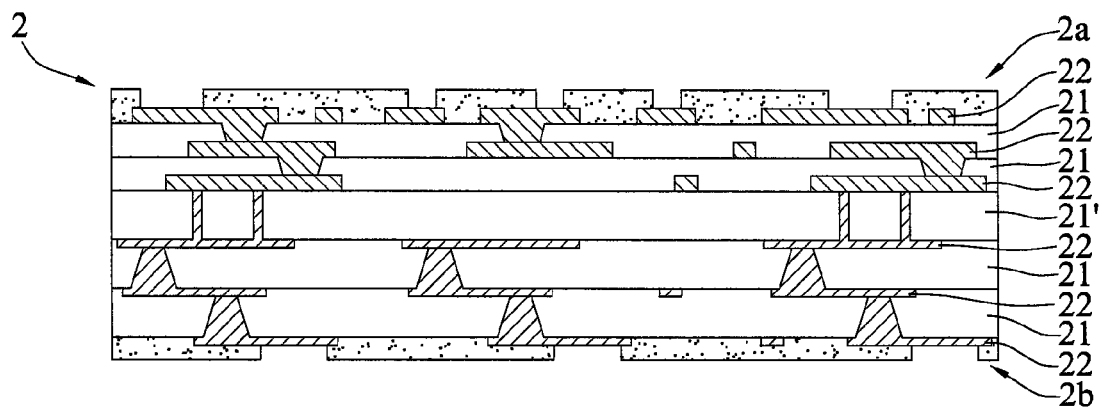
FIG. 2 is a schematic cross-sectional view of a package substrate of the present invention.

FIG. 2 is a schematic cross-sectional view of a package substrate of the present invention. Referring to FIG. 2, the package substrate 2 has: a plurality of dielectric layers 21; and a plurality of circuit layers 22 alternately stacked with the dielectric layers 21. At least two of the circuit layers 22 have a difference in thickness. One of the dielectric layers 21 is a core layer 21' and the circuit layers 22 are symmetrically formed on two opposite sides of the core layer 21'.

In the above-described package substrate, the circuit layer 22 on or close in position to an upper surface 2a of the package substrate 2 is greater in thickness than the circuit layer 22 on or close in position to a lower surface 2b of the package substrate 2. The upper surface 2a of the package substrate 2 is a chip mounting surface and the lower surface 2b of the package substrate 2 is a non-chip mounting surface.

In an embodiment, the uppermost circuit layer 22 closest in position to the upper surface 2a is greater in thickness than the other circuit layers 22, the lowermost circuit layer 22 closest in position to the lower surface 2b is less in thickness than the other circuit layers 22, and the circuit layers 22 except the uppermost and lowermost circuit layers 22 have a same thickness. For example, six circuit layers 22 are provided. The six circuit layers 22, from the upper surface 2a to the lower surface 2b of the package substrate 2, can have thicknesses of 26 um, 19 um, 19 um, 19 um, 19 um and 12 um, respectively.

In another embodiment, the thicknesses of the circuit layers 22 gradually decrease from the upper surface 2a to the lower surface 2b of the package substrate 2. For example, six circuit layers 22 can be provided. From the upper surface 2a to the lower surface 2b of the package substrate 2, the six circuit layers 22 can have thicknesses of 26 um, 23 um, 19 um, 19 um, 15 um and 12 um, respectively.

In another embodiment, the sum of the thicknesses of half of the circuit layers 22 close in position to the upper surface 2a of the package substrate 2 is greater than the sum of the thicknesses of half of the circuit layers 22 close in position to the lower surface 2b of the package substrate 2. For example, six circuit layers 22 can be provided, and the thicknesses of the circuit layers 22 from the upper surface 2a to the lower surface 2b of the package substrate 2 are 26 um, 24 um, 20 um, 18 um, 14 um and 12 um, respectively.

In another embodiment, referring to FIG. 2, six circuit layers 22 are provided, and the thicknesses of the circuit layers 22 from the upper surface 2a to the lower surface 2b of the package substrate 2 are 22 um, 22 um, 22 um, 16 um, 16 um and 16 um, respectively.

In the above-described package substrate, the thickest circuit layer 22 and the thinnest circuit layer 22 have a thickness ratio of 1.2:1 to 2:1. Preferably, the thickest circuit layer 22 and the thinnest circuit layer 22 have a thickness ratio of 1.5:1.

The thickest circuit layer 22 and the thinnest circuit layer 22 have a thickness difference of 3 to 15 um. Preferably, the thickest circuit layer 22 and the thinnest circuit layer 22 have a thickness difference of 5 to 10 um.

In the package substrate of the present invention, the number of the circuit layers 22 can be an odd or even number.

Figure 3:
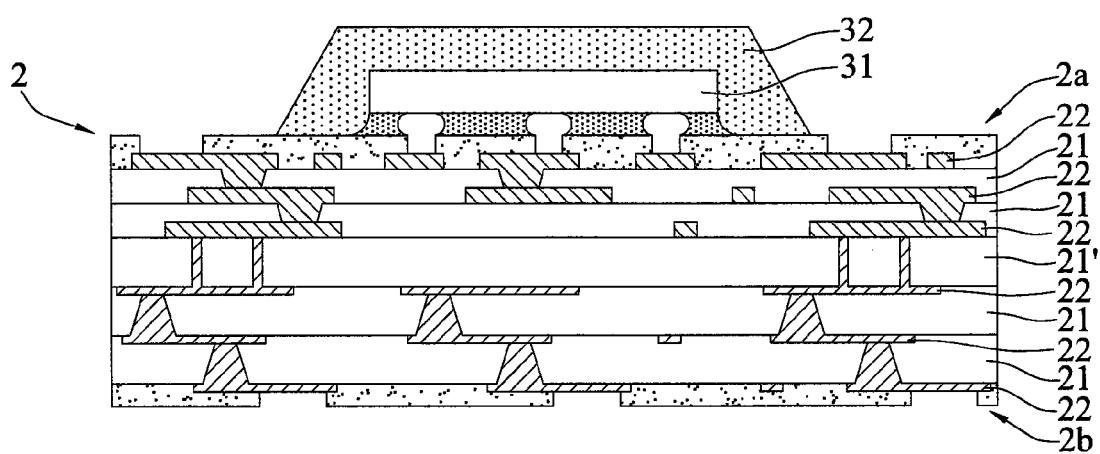
FIG. 3 is a schematic cross-sectional view of a package structure of the present invention.

FIG. 3 is a schematic cross-sectional view of a package structure of the present invention. Referring to FIG. 3, a chip 31 is mounted on the upper surface 2a of the package substrate 2 and an encapsulant 32 is formed to encapsulate the chip 31.

Therefore, by providing a thickness difference between the circuit layers, the present invention increases the rigidity of the package substrate so as to reduce warpage of the package substrate by 5% to 25%. Further, the sum of the thicknesses of the circuit layers can be kept unchanged so as to prevent increase of the overall thickness of the package substrate and structure and hence meet the miniaturization requirement of electronic products.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package substrate, comprising:
    a plurality of dielectric layers;
    a plurality of conductive vias formed in the dielectric layers; and
    a plurality of circuit layers being metal layers alternately stacked with the dielectric layers with the circuit layers being electrically connected to one another via the conductive vias,
    wherein one of the dielectric layers is a core layer, the circuit layers are symmetrically formed on two opposite sides of the core layer, and each of upper circuit layers above the core layer is greater in thickness than each of lower circuit layers below the core layer, and
    wherein the uppermost circuit layer closest in position to an upper surface of the package substrate is greater in thickness than the other circuit layers, the lowermost circuit layer closest in position to a lower surface of the package substrate is less in thickness than the other circuit layers, the upper circuit layers except the uppermost circuit layer have a same thickness, and the lower circuit layers except the lowermost circuit layer have a same thickness.

2. The substrate of claim 1, wherein the upper surface of the package substrate is a chip mounting surface and the lower surface of the package substrate is a non-chip mounting surface.

3. The substrate of claim 1, wherein the sum of the thicknesses of half of the circuit layers close in position to the upper surface of the package substrate is greater than the sum of the thicknesses of half of the circuit layers close in position to the lower surface of the package substrate.

4. The substrate of claim 1, wherein the thickest circuit layer and the thinnest circuit layer have a thickness ratio of 1.2:1 to 2:1.

5. The substrate of claim 4, wherein the thickest circuit layer and the thinnest circuit layer have a thickness ratio of 1.5:1.

6. The substrate of claim 1, wherein the thickest circuit layer and the thinnest circuit layer have a thickness difference of 3 to 15 um.

7. The substrate of claim 6, wherein the thickest circuit layer and the thinnest circuit layer have a thickness difference of 5 to 10 um.

8. The substrate of claim 1, wherein the number of the circuit layers is an odd or even number.

9. A package structure, comprising:
    a package substrate having a plurality of dielectric layers, a plurality of conductive vias formed in the dielectric layers, and a plurality of circuit layers being metal layers alternately stacked with the dielectric layers with the circuit layers being electrically connected to one another via the conductive vias, wherein one of the dielectric layers is a core layer, the circuit layers are symmetrically formed on two opposite sides of the core layer, and each of upper circuit layers above the core layer is greater in thickness than each of lower circuit layers below the core layer, and wherein the uppermost circuit layer closest in position to an upper surface of the package substrate is greater in thickness than the other circuit layers, the lowermost circuit layer closest in position to a lower surface of the package substrate is less in thickness than the other circuit layers, the upper circuit layers except the uppermost circuit layer have a same thickness, and the lower circuit layers except the lowermost circuit layer have a same thickness; and a chip mounted on an upper surface of the package substrate.

10. The structure of claim 9, wherein the sum of the thicknesses of half of the circuit layers close in position to the upper surface of the package substrate is greater than the sum of the thicknesses of half of the circuit layers close in position to the lower surface of the package substrate.

11. The structure of claim 9, wherein the thickest circuit layer and the thinnest circuit layer have a thickness ratio of 1.2:1 to 2:1.

12. The structure of claim 11, wherein the thickest circuit layer and the thinnest circuit layer have a thickness ratio of 1.5:1.

13. The structure of claim 9, wherein the thickest circuit layer and the thinnest circuit layer have a thickness difference of 3 to 15 um.

14. The structure of claim 13, wherein the thickest circuit layer and the thinnest circuit layer have a thickness difference of 5 to 10 um.

15. The structure of claim 9, wherein the number of the circuit layers is an odd or even number.

16. A package substrate, comprising:
a plurality of dielectric layers;
a plurality of conductive vias formed in the dielectric layers; and
a plurality of circuit layers being metal layers alternately stacked with the dielectric layers with the circuit layers being electrically connected to one another via the conductive vias, wherein one of the dielectric layers is a core layer, the circuit layers are symmetrically formed on two opposite sides of the core layer, and each of upper circuit layers above the core layer is greater in thickness than each of lower circuit layers below the core layer, and wherein the upper circuit layers have a same thickness and the lower circuit layers have a same thickness.

17. A package structure, comprising:
a package substrate having a plurality of dielectric layers, a plurality of conductive vias formed in the dielectric layers, and a plurality of circuit layers being metal layers alternately stacked with the dielectric layers with the circuit layers being electrically connected to one another via the conductive vias, wherein one of the dielectric layers is a core layer, the circuit layers are symmetrically formed on two opposite sides of the core layer, and each of upper circuit layers above the core layer is greater in thickness than each of lower circuit layers below the core layer, and wherein the upper circuit layers have a same thickness and the lower circuit layers have a same thickness; and a chip mounted on an upper surface of the package substrate.

* * * * *